United States Patent [19]

Kim et al.

[11] Patent Number: 4,558,239

[45] Date of Patent: Dec. 10, 1985

[54] HIGH IMPEDANCE AMPLIFIER FOR AN IC CHIP

[75] Inventors: Suk K. Kim, Bridgewater; Hanafy E. S. Meleis, New Providence, both of N.J.

[73] Assignee: AT&T Bell Laboratories, Murray Hill, N.J.

[21] Appl. No.: 523,967

[22] Filed: Aug. 17, 1983

[51] Int. Cl.⁴ ............................................. H03K 3/023
[52] U.S. Cl. ..................................... 307/494; 307/501; 307/548; 307/560; 307/576; 330/284
[58] Field of Search ............... 307/494, 496, 497, 500, 307/501, 546, 548, 550, 560, 579, 575–577; 330/254, 284

[56] References Cited

U.S. PATENT DOCUMENTS

| | | | |
|---|---|---|---|
| 3,537,025 | 10/1970 | Baum et al. | 307/546 X |
| 3,591,854 | 7/1971 | Cole | 307/579 X |
| 4,093,874 | 6/1978 | Pollitt | 307/577 |
| 4,125,789 | 11/1978 | Van Schoiack | 307/494 X |
| 4,200,843 | 4/1980 | Egami et al. | 307/494 X |
| 4,341,963 | 7/1982 | Jensen et al. | 307/497 |
| 4,350,964 | 9/1982 | Chambers, Jr. | 307/494 X |
| 4,525,636 | 6/1985 | Kominami et al. | 307/494 X |

Primary Examiner—Stanley D. Miller
Assistant Examiner—D. R. Hudspeth
Attorney, Agent, or Firm—Herbert M. Shapiro; David I. Caplan

[57] ABSTRACT

A high impedance is implemented in the input bias path of an integrated instrumentation amplifier. The implementation includes a normally on transistor switch. A signal from the output of the amplifier is used to turn the switch off to provide the requisite high impedance. Otherwise, the switch is on to provide low impedance for proper biasing. The circuit is adapted for encoded input signals such as occur in capacitive coupled credit card encoding circuits.

9 Claims, 5 Drawing Figures

HIGH IMPEDANCE AMPLIFIER FOR AN IC CHIP

FIELD OF THE INVENTION

This invention relates to semiconductor integrated circuit (IC) chips and, more particularly, to such chips including a high impedance amplifier.

BACKGROUND OF THE INVENTION

It is common to apply differentially coded pulses to an encoding circuit for recording or for direct transmission. Such a circuit typically includes first and second input amplifiers and first and second output comparators. Such coded pulses are applied to inputs to the amplifiers resulting in corresponding changes in the amplifier output voltages.

The input circuit must exhibit high impedance when pulses are applied. Typically, 40 megohm resistors are necessary to achieve the requisite high impedance. The problem is that such resistors cannot be implemented on chip, and they are too expensive to implement off chip. Although the requisite high impedance can be achieved by the use of a current source, such sources are process sensitive. Accordingly, such an approach is not attractive.

BRIEF DESCRIPTION OF THE INVENTION

The problem of providing a high impedance on chip is overcome by including a switch arrangement in the bias path for the input amplifiers of the circuit. Moreover, the outputs of output comparators of the circuit are applied to a NOR circuit. The output of the NOR circuit, in turn, is adapted via a feedback path to open the switch when an input is applied to the input amplifiers. In this manner, the input is applied under high impedance conditions. The switch arrangement is closed between inputs so that the amplifiers are DC biased properly.

DETAILED DESCRIPTION

Figure 1:
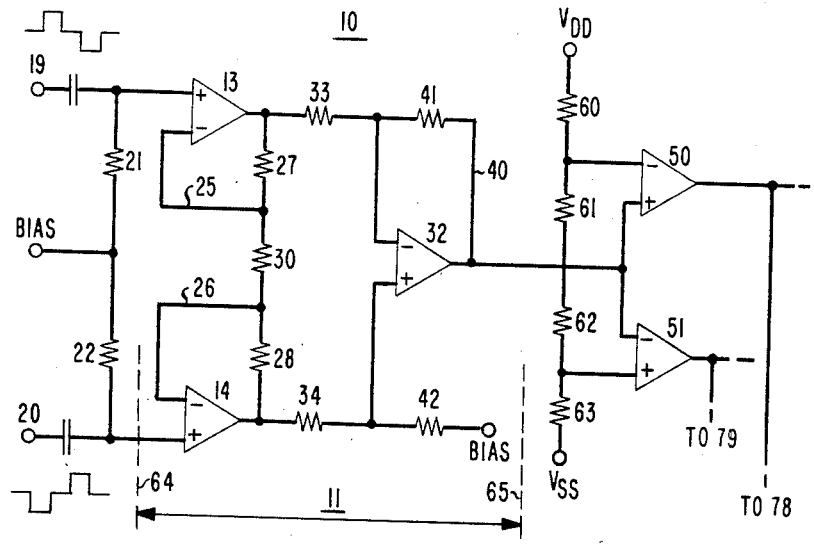
FIG. 1 shows a CMOS IC chip including a circuit schematic of a prior art data transfer arrangement.

FIG. 1 shows an integrated circuit chip 10 including a prior art data transfer arrangement 11. The arrangement includes amplifiers 13 and 14 to positive inputs of which differentially coded input signals are applied. The signals are applied via capacitors 16 and 17 at input terminals 19 and 20. The positive input terminals to amplifiers 13 and 14 are connected to a source of bias voltage via resistors 21 and 22, respectively. The output terminals of amplifiers 13 and 14 are connected via feedback paths 25 and 26 to the negative input terminals of the associated amplifiers via resistors 27 and 28, respectively. The feedback paths are connected to one another by resistor 30.

The output terminals of amplifiers 13 and 14 are connected to the negative and positive input terminals, respectively, of amplifier 32 via resistors 33 and 34. The output terminal of amplifier 32 is also connected to the negative input terminal of amplifier 32 via a feedback path 40 including resistor 41. The positive input terminal of amplifier 32 is connected to ground via resistor 42.

The output terminal of amplifier 32 is connected to the positive and negative input terminals of output comparators 50 and 51, respectively. A voltage divider is formed by a series connection of resistors 60, 61, 62 and 63 between $V_{DD}$ and $V_{SS}$. The negative input terminal of comparator 50 is connected to the voltage divider between resistors 60 and 61. Similarly, the positive input terminal of comparator 51 is connected to the voltage divider between resistors 62 and 63.

The arrangement of FIG. 1 between broken lines 64 and 65 is commonly called an instrumentation amplifier and uses two noninverting amplifiers to provide a very high input impedance differential amplifier function. The dual (input) amplifier first stage, comprising amplifiers 13 and 14, are combined with a "subtractor" amplifier 32 to provide a single-ended output in response to the difference between signals applied at the input terminals (19 and 20). High impedance at the input is necessary to get a satisfactory RC constant so that comparator 50 or 51 can detect a true pulse and not respond to unwanted spikes, as is well understood.

In operation, a differential amplifier responds to a differentially coded input signal at a time when the positive input terminal to the amplifier is biased at 2.5 volts. That is to say, input signals at each of input terminals 19 and 20 comprise a pulse of a first polarity followed by an oppositely poled pulse of a second polarity where the first pulse starts at a reference of 2.5 volts and rises to 5 volts and the second starts at 2.5 volts and drops to zero. We will assume that the first pulses on terminals 19 and 20 are positive and negative, respectively. The various resistors 27, 28, 30, 33, 34, 41 and 42 are chosen to reject common mode noise.

In response to the differential input signals, amplifiers 13 and 14 apply output signals to the positive and negative input terminals of amplifier 32. If the differential between the input terminals is positive, amplifier 32 responds to apply a positive output voltage to the positive and negative input terminals of output comparators 50 and 51, respectively. If, on the other hand, the differential is negative, amplifier 32 applies a negative voltage to those input terminals. In either case, one of output comparators 50 or 51 provides an output indicative of the differential between input terminals 19 and 20.

Figure 2:
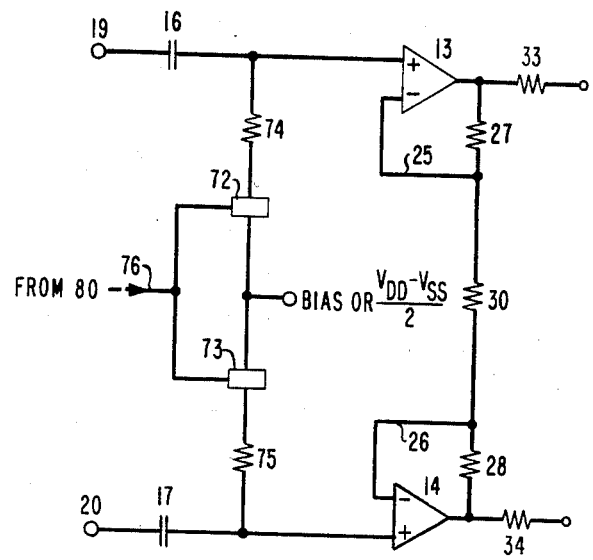
FIGS. 2 and 3 show circuit schematics of portions of a data transfer circuit in accordance with this invention.

For proper operation, resistors 21 and 22 of FIG. 1 are required to provide high impedance when differentially coded signals are applied to input terminals 19 and 20. In order to provide the requisite impedance for CMOS integration, the resistor arrangement between the positive input terminals of amplifiers 13 and 14 is replaced by an arrangement of transistor switches 72 and 73, as shown in FIG. 2. This scheme is made possible because in the absence of an input signal, high impedance is not required and only a current path to the bias voltage is required.

Specifically, FIG. 2 shows each of switches 72 and 73 comprising an insulated gate field effect transistor (IGFET) with sources connected to ground and drains connected through resistors 74 and 75 to the positive input terminals of amplifiers 13 and 14, respectively. The gate electrodes of transistors 72 and 73 are connected to a conductor 76. Switches 72 and 73 are normally on, resulting in a voltage of 2.5 volts being applied normally to the positive input terminal of each of amplifiers 13 and 14. When an input signal occurs though, the transistors are turned off by a pulse on conductor 76.

Figure 3:
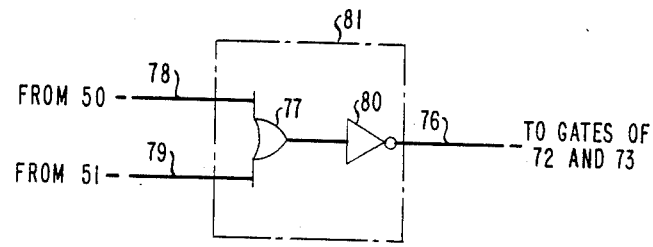

The pulse on conductor 76 is generated in response to an output from either of comparators 50 or 51. FIG. 3 shows an OR circuit 77 with first and second input terminals 78 and 79. The output terminals of comparators 50 and 51 are connected to input terminals 78 and 79, respectively. The output terminal of circuit 77 is connected to the input terminal of an inverter 80. Conductor 76 of FIG. 2 is connected to the output terminal of inverter 80. OR circuit 77 and inverter 80 operate as a NOR circuit 81. In response to an output from either of comparators 50 or 51, NOR circuit 81 provides a pulse on conductor 76 for turning off transistors 72 and 73.

Consequently, the requisite high impedance is provided when a coded input pulse occurs. Of course, at the termination of the coded input, the control pulse on conductor 76 terminates. Consequently, transistors 72 and 73 turn on to provide the proper bias at the inputs of the input amplifier.

Transistors 72 and 73 can be implemented in CMOS integrated circuit technology along with all the required remaining components of FIGS. 1, 2 and 3. One implementation employs the bilateral transmission gate arrangement of FIG. 4 for each switch. The arrangement comprises P-type and N-type transistors 90 and 91, respectively. The gate electrodes of transistors 90 and 91 are connected to inverter 80 of FIG. 3, an inverter 92 being located in the path to the gate of transistor 90. The source-to-drain paths are connected (through the resistor 74) between amplifier 13 and a source of bias voltage as shown for use as switch 72. A like bilateral transmission arrangement is used for switch 73.

Figure 4:
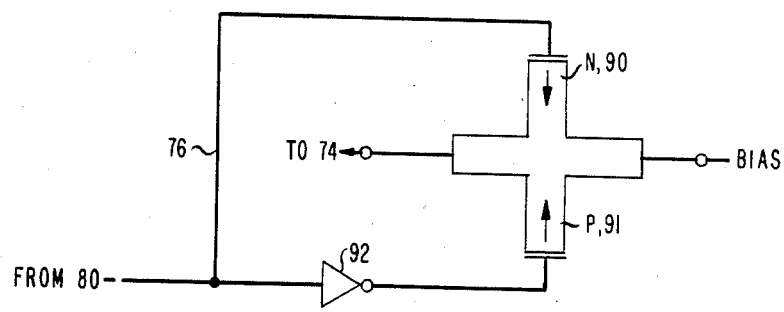
FIGS. 4 and 5 are schematic diagrams of a switch arrangement for switching to high impedance conditions and which can be integrated in CMOS technology.
Figure 5:
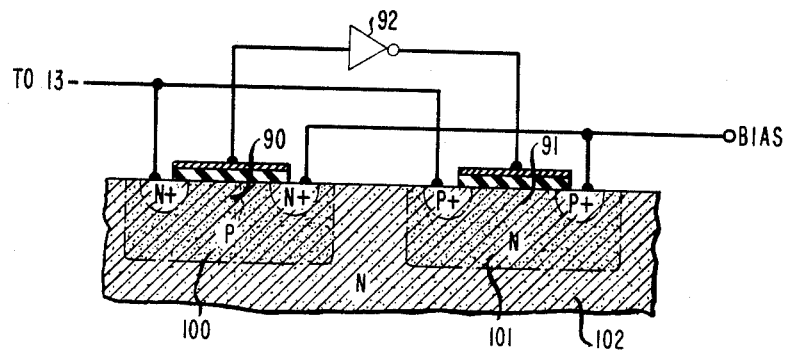

FIG. 5 shows a twin tub implementation of the transmission arrangement of FIG. 4. Surface tub regions 100 and 101 of P- and N-type conductivity, respectively, are formed in an N-type substrate 102. Transistors 90 and 91 are formed between N+ surface regions of P tub 100 and the P+ surface regions of N tub 101, as shown. The electrical connections are consistent with those of FIG. 3.

Switch arrangements for implementing an on-chip, high impedance differential amplifier arrangement in other integrated circuit technologies such as bipolar technologies are similar.

What is claimed is:

1. An integrated circuit comprising:
   (a) differential amplifier means, connected to receive first and second inputs of a differentially coded input signal, for providing an output signal which is indicative of the difference between the first and second inputs;
   (b) switchable input impedance means coupled to the amplifier means such that the magnitude of the resulting input impedance of the amplifier means is switched from one value to another in response to a control signal supplied to the switchable impedance means; and
   (c) feedback means, responsive to the output signal, connected for supplying the control signal to the switchable input impedance means, whereby the magnitude of the input impedance of the amplifier means is switched from a higher value to a lower value when the difference between the first and second inputs goes inside a prescribed range and is switched from the lower value to the higher value when said difference goes outside the range.

2. The circuit of claim 1 wherein the switchable impedance means is essentially a CMOS-type transmission gate connected in series with a substantially constant impedance element.

3. An integrated circuit comprising:
   (a) amplifier means for providing first and second outputs in response to first and second inputs of a differentially coded input signal;
   (b) subtractor means, having first and second input terminals coupled to the amplifier means, connected for receiving the first and second outputs and for providing a third output indicative of the difference between the first and second outputs and hence also of the difference between the first and second inputs;
   (c) switchable input impedance means connected for switching the magnitude of the input impedance of the amplifier means into one or the other of two different prescribed values;
   (d) feedback means, responsive to the third output, connected for providing a control signal to the input impedance means such that the magnitude of the resulting input impedance becomes equal to the lower of the two prescribed values when the absolute value of the third output becomes less than a prescribed magnitude and becomes equal to the higher of the two prescribed values when the absolute value of the third output becomes more than the prescribed magnitude.

4. The integrated circuit of claim 5 wherein the switchable input impedance means is essentially a CMOS-type transmission gate connected in series with a substantially constant impedance element.

5. The circuit of claim 4 wherein the feedback means comprises
   (a) comparator means, connected for receiving the third output, for generating a fourth output that is indicative of whether or not the absolute value of the third output is less than a predetermined magnitude; and
   (b) logic means, connected for receiving the fourth output, for generating the control signal.

6. The circuit of claim 5 wherein the amplifier means comprises first and second input amplifiers respectively having first and second output terminals, respectively, coupled to the first and second input terminals, respectively, of the subtractor means,
   each of the first and second input amplifiers further having a separate inverting and a separate noninverting terminal, the inverting terminals of the first and second input amplifiers being coupled to each other through a first two-terminal impedance element, and the noninverting terminals of the first and second input amplifiers being connected for receiving the first and second inputs, respectively, of the differentially coded input signal.

7. The circuit of claim 4 wherein the amplifier means comprises first and second input amplifiers respectively having first and second output terminals, respectively, coupled to the first and second input terminals, respectively, of the subtractor means,
   each of the first and second input amplifiers further having a separate inverting and a separate noninverting terminal, the inverting terminals of the first and second input amplifiers being coupled to each other through a first impedance element, and the noninverting terminals of the first and second input amplifiers being connected for receiving the first and second inputs, respectively, of the differentially coded input signal.

8. The circuit of claim 4 wherein the input impedance means comprises a first transmission gate including first and second field effect transistors of mutually opposite conductivity type whose source-drain paths are mutually connected in parallel, the gate electrodes of the first and second transistors being separately connected for receiving the control signal and its inverse, respectively, and wherein the source-drain paths of the first and second transistors are each connected to one terminal of a second two-terminal impedance element, and wherein the other terminal of the second input impedance element is connected to the noninverting input terminal of the first input amplifier.

9. The circuit of claim 8 wherein the input impedance means further comprises a second transmission gate including third and fourth field effect transistors of mutually opposite conductivity type whose source-drain paths are mutually connected in parallel, the gate electrodes of the third and fourth transistors being separately connected for receiving the control signal and its inverse, respectively, and wherein the source-drain paths of the third and fourth transistors are each connected to one terminal of a third two-terminal impedance element, and wherein the other terminal of the third impedance element is connected to the noninverting input terminal of the second input amplifier.

* * * * *

UNITED STATES PATENT AND TRADEMARK OFFICE
CERTIFICATE OF CORRECTION

PATENT NO. : 4,558,239
DATED : December 10, 1985
INVENTOR(S) : Suk K. Kim and Hanafy E. S. Meleis It is certified that error appears in the above-identified patent and that said Letters Patent is hereby corrected as shown below:

Column 4, line 32, "claim 5" should read --claim 3--.

Signed and Sealed this

First Day of February, 1994

Attest:

BRUCE LEHMAN

*Attesting Officer*         *Commissioner of Patents and Trademarks*